M|||||||||||||||||||||||||||||||||||||||||||||||||||||
US010325799B2

(12) United States Patent
Du Bois et al.

(10) Patent No.: US 10,325,799 B2
(45) Date of Patent: Jun. 18, 2019

(54) DUAL TEMPERATURE HEATER

(71) Applicant: Applied Materials, Inc., Santa Clara, CA (US)

(72) Inventors: Dale R. Du Bois, Los Gatos, CA (US); Juan Carlos Rocha-Alvarez, San Carlos, CA (US); Sanjeev Baluja, Campbell, CA (US); Ganesh Balasubramanian, Sunnyvale, CA (US); Lipyeow Yap, Santa Clara, CA (US); Jianhua Zhou, Campbell, CA (US); Thomas Nowak, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 340 days.

(21) Appl. No.: 14/875,392

(22) Filed: Oct. 5, 2015

(65) Prior Publication Data
US 2016/0093521 A1    Mar. 31, 2016

Related U.S. Application Data

(63) Continuation of application No. 12/851,794, filed on Aug. 6, 2010, now abandoned.
(Continued)

(51) Int. Cl.
*B05C 13/00* (2006.01)
*H01L 21/68* (2006.01)
(Continued)

(52) U.S. Cl.
CPC .............. *H01L 21/68* (2013.01); *B05C 13/00* (2013.01); *C23C 16/4585* (2013.01);
(Continued)

(58) Field of Classification Search
None
See application file for complete search history.

(56) References Cited

U.S. PATENT DOCUMENTS

| 5,871,811 A | 2/1999 | Wang et al. |
| 5,954,072 A | 9/1999 | Matusita |

(Continued)

FOREIGN PATENT DOCUMENTS

| EP | 1079429 A1 | 2/2001 |
| JP | 11297802 A | 10/1999 |

(Continued)

OTHER PUBLICATIONS

English translation of Susumu, JP 2003-100851.*
(Continued)

*Primary Examiner* — Charles Capozzi
(74) *Attorney, Agent, or Firm* — Patterson + Sheridan (57) ABSTRACT

A method and apparatus for heating a substrate in a chamber are provided. an apparatus for positioning a substrate in a processing chamber. In one embodiment, the apparatus comprises a substrate support assembly having a support surface adapted to receive the substrate and a plurality of centering members for supporting the substrate at a distance parallel to the support surface and for centering the substrate relative to a reference axis substantially perpendicular to the support surface. The plurality of the centering members are movably disposed along a periphery of the support surface, and each of the plurality of centering members comprises a first end portion for either contacting or supporting a peripheral edge of the substrate.

9 Claims, 9 Drawing Sheets

Related U.S. Application Data (60) Provisional application No. 61/232,172, filed on Aug. 7, 2009.

(51) Int. Cl.
*C23C 16/458* (2006.01)
*H01J 37/32* (2006.01)
*H01L 21/687* (2006.01)
*H01L 21/324* (2006.01)
*H01L 21/67* (2006.01)

(52) U.S. Cl.
CPC ...... *H01J 37/32091* (2013.01); *H01L 21/324* (2013.01); *H01L 21/67103* (2013.01); *H01L 21/6875* (2013.01); *H01L 21/68728* (2013.01)

(56) References Cited

U.S. PATENT DOCUMENTS

| | | | |
|---|---|---|---|
| 6,042,687 A | 3/2000 | Singh et al. | |
| 6,167,893 B1 | 1/2001 | Taatjes et al. | |
| 6,273,484 B1 | 8/2001 | Peng | |
| 6,374,508 B1* | 4/2002 | Yudovsky | C23C 16/4583 269/53 |
| 6,478,924 B1 | 11/2002 | Shamouilian et al. | |
| 6,986,636 B2 | 1/2006 | Konig et al. | |
| 8,210,190 B2 | 7/2012 | Ito et al. | |
| 2004/0194706 A1 | 10/2004 | Wang et al. | |
| 2006/0157998 A1 | 7/2006 | Gershenzon et al. | |
| 2006/0219179 A1* | 10/2006 | Sundar | C23C 16/4585 118/729 |
| 2007/0131173 A1* | 6/2007 | Halpin | C23C 16/4586 118/728 |
| 2008/0038479 A1* | 2/2008 | Orihara | H01L 21/67115 427/553 |
| 2009/0017228 A1 | 1/2009 | Du Bois et al. | |
| 2009/0056758 A1* | 3/2009 | Ito | H01L 21/67051 134/18 |
| 2009/0097184 A1 | 4/2009 | Buchberger, Jr. et al. | |
| 2009/0110520 A1 | 4/2009 | Kanawade et al. | |

FOREIGN PATENT DOCUMENTS

| | | |
|---|---|---|
| JP | 2001274226 A | 10/2001 |
| JP | 2003100851 A | 4/2003 |
| JP | 2004087571 A | 3/2004 |
| JP | 2006310709 A | 11/2006 |
| JP | 2007102372 A | 4/2007 |
| JP | 2007220868 A | 8/2007 |
| JP | 2008177507 A | 7/2008 |
| JP | 2009060063 A | 3/2009 |
| JP | 2011040656 A | 2/2011 |
| TW | M318185 U | 9/2007 |
| TW | I305928 B | 2/2009 |
| WO | 2009009606 A1 | 1/2009 |
| WO | 2009045947 A1 | 4/2009 |

OTHER PUBLICATIONS

English translation of Masashi, JP 11-297802.*
Office Action and Search Report for Taiwan Invention Patent Application No. 099124957; dated Jun. 2, 2015.
Office Action English Translation for Taiwan Invention Patent Application No. 099124957.
Office Action for Japanese Application No. 2012-523640 dated Mar. 3, 2015.
Office Action for Chinese Application No. 201080035135.1 dated Jan. 29, 2015.
Search Report and Office Action for Chinese Application No. 201080035135.1 dated Apr. 23, 2014.
Office Action for Japanese Application No. 2012-523640 dated Apr. 8, 2014.
International Preliminary Report on Patentability for International Application No. PCT/US10/43274 dated Feb. 7, 2012.
International Search Report and Written Opinion of the International Searching Authority; dated Feb. 23, 2011 in PCT/US2010/043274.
Office Action for U.S. Appl. No. 12/851,794 dated Mar. 23, 2012.
Final Office Action for U.S. Appl. No. 12/851,794 dated Jun. 6, 2012.
English translation of Eisuke et al, JP-2008-177507.
English translation of Masashi et al JP 11-297802.

* cited by examiner

DUAL TEMPERATURE HEATER

CROSS-REFERENCE TO RELATED APPLICATIONS

This application is a continuation of co-pending U.S. patent application Ser. No. 12/851,794 which claims benefit of U.S. provisional patent application Ser. No. 61/232,172, filed Aug. 7, 2009, both of which are herein incorporated by reference in their entirety.

BACKGROUND OF THE INVENTION

Field of the Invention

Embodiments of the present invention generally relate to apparatus and methods for processing semiconductor substrates. More particularly, embodiments of the present invention relate to an apparatus and methods for heating a substrate in a chamber.

Description of the Related Art

The effectiveness of a substrate fabrication process is often measured by two related and important factors, which are device yield and the cost of ownership (CoO). These factors are important since they directly affect the cost to produce an electronic device and thus a device manufacturer's competitiveness in the market place. The CoO, while affected by a number of factors, is greatly affected by the system and chamber throughput, or simply the number of substrates per hour processed using a desired processing sequence.

During certain substrate processing sequences, such as, for example, chemical vapor deposition processes (CVD) or plasma enhanced chemical vapor deposition processes (PECVD), it may be desirable to pre-treat a substrate prior to performing a deposition process. In certain pre-treatment processes, the substrate may be heated, for example, using an anneal process, to a first temperature prior to the deposition process. During the deposition process, the substrate is heated to a second temperature different from the first temperature. For many deposition processes, the substrate is placed on a substrate support comprising a heater. This heater is used to heat the substrate to both the first temperature and the second temperature. When there is some variance between the first temperature and the second temperature, for example, when the second temperature is higher than the first temperature, there is a delay between the pre-treatment process and the deposition process so that the temperature of the heater may be increased from the first temperature to the second temperature. This delay leads to an overall increase in substrate processing time and a corresponding decrease in device yield.

Therefore, there is a need for an apparatus and process that can position and heat a substrate in a processing chamber in a cost-effective and accurate manner.

SUMMARY OF THE INVENTION

Embodiments of the present invention generally relate to apparatus and methods for processing semiconductor substrates. More particularly, embodiments of the present invention relate to an apparatus and methods for heating a substrate in a chamber. In one embodiment, an apparatus for positioning a substrate in a processing chamber is provided. The apparatus comprises a substrate support assembly having a support surface adapted to receive the substrate and a plurality of centering members for supporting the substrate at a distance parallel to the support surface and for centering the substrate relative to a reference axis substantially perpendicular to the support surface. The plurality of centering members are movably disposed along a periphery of the support surface, and each of the plurality of centering members comprises a first end portion for either contacting or supporting a peripheral edge of the substrate, the first end portion comprising an upper end portion extending above the support surface of the substrate support for releasably contacting the peripheral edge of the substrate, a support tab positioned on the upper end portion, and a substrate support notch formed by an intersection of the support tab and the upper end portion, for supporting the substrate. The first end portion is movable between a first position and a second position. Movement from the first position to the second position causes the centering member to release the peripheral edge of the substrate and movement from the second position to the first position causes the centering member to push the substrate in a direction toward the reference axis or positions the centering members for supporting the substrate.

In another embodiment, a method for centering a substrate in a processing chamber is provided. A substrate support having an embedded heater and a heated support surface adapted to receive a substrate is provided. A plurality of centering members disposed along a circle centered at a reference axis substantially perpendicular to the support surface is provided. Each centering member comprises an end portion configured to contact a peripheral edge of the substrate, and the end portion is radially movable towards and away from the reference axis. A support tab is positioned on the end portion and a substrate support notch is formed at an intersection of the support tab and the end portion, for supporting the substrate at a distance from the support surface of the substrate support. The substrate is positioned on the support tabs of each of the plurality of centering members. A pre-treatment process is performed on the substrate at a first processing temperature of the substrate. The substrate is removed from the support tabs. The end portion of each centering member is moved radially outward and away from the reference axis. The substrate is placed on the substrate support, wherein the substrate and the centering members do not contact. The end portion of each centering member is moved radially inwards to contact a peripheral edge of the substrate for centering the substrate. The substrate is positioned with the end portions of the centering members. A deposition process is performed on the substrate at a second processing temperature of the substrate, wherein the first processing temperature is different from the second processing temperature.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein relate to an apparatus and method for heating and centering a substrate that are applicable for various chamber systems configured to apply diverse semiconductor processes on a substrate. Although the embodiments are exemplarily described for use in a deposition chamber, some embodiments may be applicable for other types of process chambers that necessitate heating and centering of a substrate. Examples include, without limitations, loadlock chambers, testing chambers, deposition chambers, etching chambers, and thermal treatment chambers.

Figure 1:
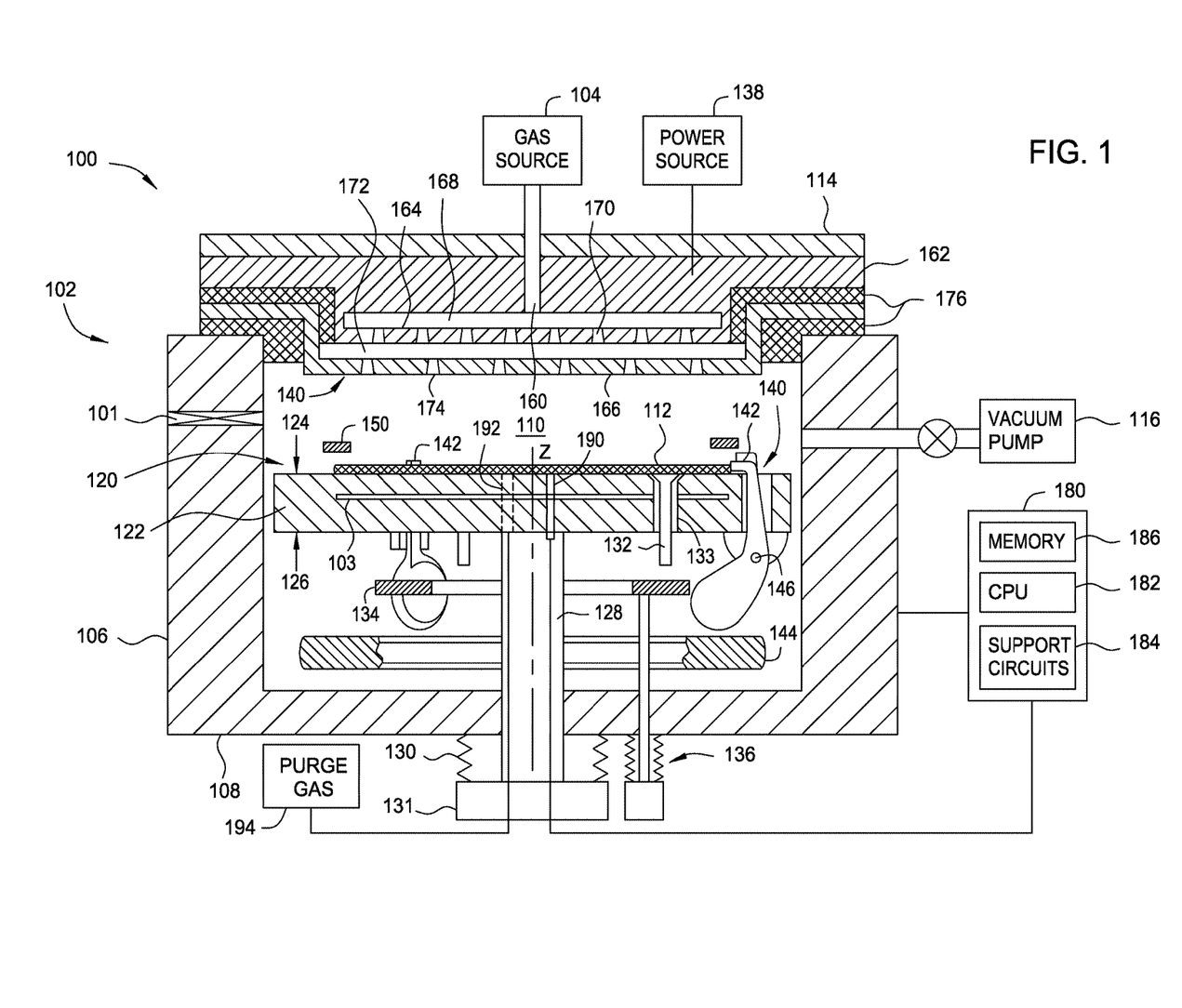
FIG. 1 is a schematic cross-sectional view of one embodiment of a PECVD system according to embodiments described herein.

FIG. 1 is a schematic cross-sectional view of one embodiment of a PECVD system 100 having a centering mechanism 140. The system 100 includes a process chamber 102 coupled to a gas source 104. The process chamber 102 has walls 106 and a bottom 108 that partially define a process volume 110. The process volume 110 may be accessed through a port 101 formed in the walls 106 that facilitate movement of a substrate 112 into and out of the process chamber 102. The walls 106 and bottom 108 may be fabricated from a unitary block of aluminum or other material compatible with processing. The walls 106 support a lid assembly 114. The process chamber 102 may be evacuated by a vacuum pump 116.

A temperature controlled substrate support assembly 120 may be centrally disposed within the process chamber 102. The support assembly 120 may support a substrate 112 during processing. In one embodiment, the support assembly 120 comprises a support base 122 made of aluminum that may encapsulate at least one embedded heater 103 operable to controllably heat the support assembly 120 and the substrate 112 positioned thereon to a predetermined temperature. In one embodiment, the support assembly 120 may operate to maintain the substrate 112 at a temperature between about 150 degrees Celsius (° C.) to about 1,000 degrees Celsius (° C.), depending on the deposition processing parameters for the material being deposited. In one embodiment, the support assembly may operate to maintain the substrate 112 at a temperature between about 250 degrees Celsius (° C.) to about 270 degrees Celsius (° C.), during a pre-treatment process such as an anneal process. In one embodiment, the support assembly may operate to maintain the substrate 112 at a temperature between about 350 degrees Celsius (° C.) to about 400 degrees Celsius (° C.), during a deposition process.

The support assembly 120 may have an upper support surface 124 and a lower surface 126. The upper support surface 124 supports the substrate 112. The lower surface 126 may have a stem 128 coupled thereto. The stem 128 couples the support assembly 120 to a lift system 131 that moves the support assembly 120 vertically between an elevated processing position and a lowered position that facilitates substrate transfer to and from the process chamber 102. The stem 128 additionally provides a conduit for purge gas and electrical and temperature monitoring leads between the support assembly 120 and other components of the system 100. A bellows 130 may be coupled between the stem 128 and the bottom 108 of the process chamber 102. The bellows 130 provides a vacuum seal between the process volume 110 and the atmosphere outside the process chamber 102 while facilitating vertical movement of the support assembly 120.

To facilitate the transfer of the substrate 112, the support base 122 also includes a plurality of openings 133 through which lift pins 132 are movably mounted. The lift pins 132 are operable to move between a first position and a second position. The first position, shown in FIG. 1, allows the substrate 112 to rest on the upper support surface 124 of the support base 122. The second position (not shown) lifts the substrate 112 above the support base 122 so that the substrate 112 can be transferred to a substrate handling robot coming through the port 101. Upward/downward movements of the lift pins 132 may be driven by a movable plate 134 connected to an actuator 136.

The support base 122 may be electrically grounded such that RF power supplied by a power source 138 to a gas distribution plate assembly 141 positioned between the lid assembly 114 and the support base 122 (or other electrode positioned within or near the lid assembly of the chamber) may excite gases present in the process volume 110 between the support base 122 and the distribution plate assembly 141. The RF power from the power source 138 may be selected commensurate with the size of the substrate 112 to drive the chemical vapor deposition process.

The support assembly 120 further comprises a centering mechanism 140 operable to center the substrate 112 relative to a vertical reference axis Z perpendicular to the substrate support plane of the support base 122. The centering mechanism 140 is also operable to support the substrate 112 at a distance parallel to a surface of the support base 122. The centering mechanism 140 comprises three or more movable centering fingers 142 positioned at a periphery of the support base 122, and an opposing plate 144 placed below the fingers 142. Each finger 142 is pivotally mounted on the support base 122 via a shaft 146. The opposing plate 144 and the support base 122 are relatively movable so that the opposing plate 144 may contact and pivot the fingers 142 in a release position and stay free from the fingers 142 in a centering position or supporting position.

Figure 2A:
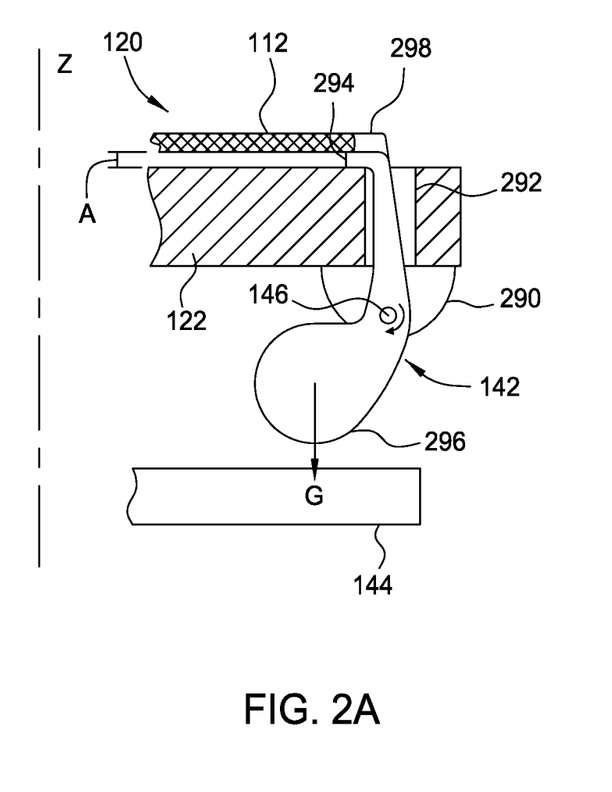
FIG. 2A is a partially enlarged cross-sectional view of one embodiment of a centering finger of FIG. 1 in a supporting position.
Figure 2B:
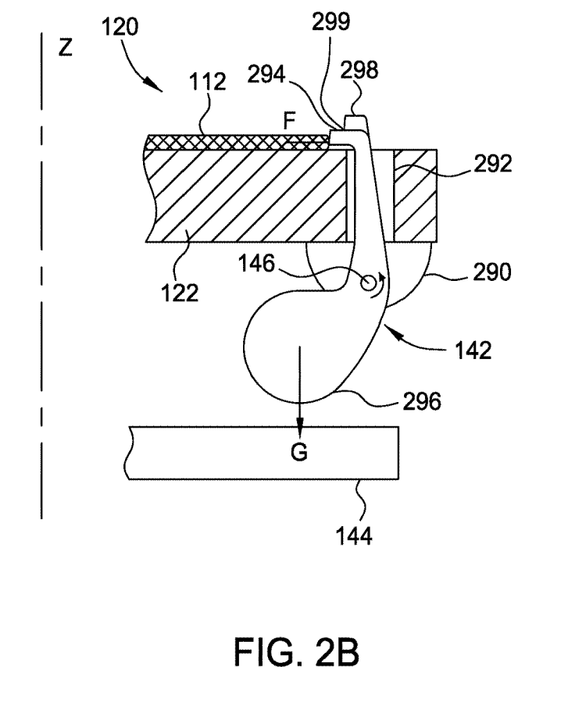
FIG. 2B is a partially enlarged cross-sectional view of one embodiment of a centering finger of FIG. 1 in a centering position.
Figure 2C:
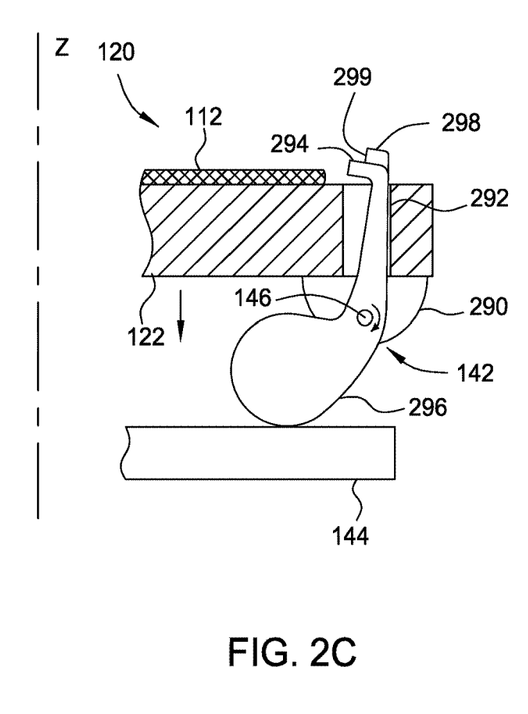
FIG. 2C is a partially enlarged cross-sectional view of one embodiment of a centering finger of FIG. 1 in a disengaging position.

In one embodiment, the opposing plate 144 is stationary and the relative movement between the support base 122 and the opposing plate 144 is due to the vertical movement of the support base 122. When there is no substrate 112 positioned on the support base 122, the fingers 142 engage in a supporting position for supporting the substrate 112 as shown in FIG. 2A. When the substrate 112 is positioned on the support base 122, the fingers 142 engage on the peripheral edge of the substrate 112 to center the substrate 112 when the support assembly 120 is in an elevated position as shown in FIG. 1 and FIG. 2B, and disengage from the peripheral edge of the substrate 112 when the support assembly 120 is in a lowered position as shown in FIG. 2C. Further details of the centering mechanism 140 and its operation will be described hereafter.

The process chamber 102 may additionally comprise a circumscribing shadow frame 150. The shadow frame 150 is positioned to prevent deposition at the edge of the substrate 112, the support assembly 120, and the centering mechanism 142 to reduce flaking and particle contamination in the process chamber 102.

The lid assembly 114 provides an upper boundary to the process volume 110. The lid assembly 114 may be removed or opened to service the process chamber 102. In one embodiment, the lid assembly 114 may be fabricated from aluminum.

The lid assembly 114 may include an entry port 160 through which process gases provided by the gas source 104 may be introduced into the process chamber 102. A gas distribution plate assembly 141 may be coupled to an interior side of the lid assembly 114. The gas distribution plate assembly 141 includes an annular base plate 162 having a blocker plate 164 disposed intermediate to a faceplate (or showerhead) 166. The blocker plate 164 provides an even gas distribution to a backside of the faceplate 166. The processing gas from the entry port 160 enters a first hollow volume 168 partially limited between the annular base plate 162 and the blocker plate 164, and then flows through a plurality of passages 170 formed in the blocker plate 164 into a second volume 172 between the blocker plate 164 and the faceplate 166. The processing gas then enters the process volume 110 from the second volume 172 through a plurality of passages 174 formed in the faceplate 166. The faceplate 166 is isolated via an insulator material 176. The annular base plate 162, blocker plate 164 and faceplate 166 may be fabricated from stainless steel, aluminum, anodized aluminum, nickel or any other RF conductive material.

The power source 138 applies a radio frequency (RF) bias potential to the annular base plate 162 to facilitate the generation of plasma between the faceplate 166 and the support base 122. The power source 138 may include a high frequency RF power source ("HFRF power source") capable of generating an RF power at about 13.56 MHz, or a low frequency RF power source ("LFRF power source") generating an RF power at about 300 kHz. The LFRF power source provides both low frequency generation and fixed match elements. The HFRF power source is designed for use with a fixed match and regulates the power delivered to the load, eliminating concerns about forward and reflected power.

As shown in FIG. 1, a controller 180 may interface with and control various components of the substrate processing system. The controller 180 may include a central processing unit (CPU) 182, support circuits 184 and a memory 186.

The substrate 112 is transferred to the lift pins 132 in the chamber 102 by a conveyor that may be a robot or other transfer mechanism (not shown), and then placed on the upper support surface 124 of the support assembly 120 by moving the lift pins 132 downward. As will be discussed below, the centering mechanism 140 then is operated to center the substrate 112 relative to the reference axis Z.

In one embodiment, one or more temperature sensors 190 are positioned to monitor the temperature of the backside of the substrate 112. In one embodiment, the one or more temperature sensors 190, such as a fiber optic temperature sensor, are coupled to the controller 140 to provide a metric indicative of the temperature profile of the backside of the substrate 112. In one embodiment, the data provided by the one or more temperature sensors 190 may be used in a feedback loop to control the temperature of the embedded heater 103. In one embodiment, the one or more temperature sensors are positioned in the support base.

In one embodiment, a purge gas may be provided to the backside of the substrate 112 through one or more purge gas inlets 192 connected to a purge gas source 194. The purge gas flown toward the backside of the substrate 112 helps prevent particle contamination caused by deposition on the backside of the substrate 112 when the substrate 112 is supported by the centering mechanism 142. The purge gas may also be used as a form of temperature control to cool the backside of the substrate 112. In one embodiment, the flow of purge gas may be controlled in response to the data provided by the one or more temperature sensors 190.

FIG. 2A is a partially enlarged cross-sectional view of one embodiment of a centering finger 142 of FIG. 1 in a supporting position. As shown in FIG. 2A, in the supporting position, the substrate 112 rests on the centering finger 142. While resting on the centering finger 142, the substrate 112 is positioned at a distance "A" from the surface of the support assembly 144. The distance "A" between the substrate 112 and the upper support surface 124 of the support base 122 is chosen such that the thermal resistance between the substrate 112 and the heater 103 creates a different temperature on the elevated substrate 112 as compared to when the substrate rests on the upper support surface 124 of the support assembly 122 without having to change the setpoint temperature of the heater 103. The ability to change the temperature of the substrate 112 without changing the setpoint temperature of the heater 103 allows for back-to-back process steps to be performed without the delay of waiting for the heater to either increase in temperature or decrease in temperature in between processing steps. Thus leading to an overall decrease in substrate processing time and a corresponding increase in device yield.

The centering finger 142 may be made in a single piece, or formed from the assembly of multiple component parts. Materials used for the finger 142 may include aluminum nitride, aluminum oxide, ceramics and similar materials or combinations thereof that have a low coefficient of thermal expansion and are resistant to the processing environment in the chamber 102. The finger 142 is pivotally mounted via the shaft 146 to a joint block 290 protruding from the lower surface 126 of the support base 122, and passes through a slot 292 in a peripheral region of the support base 122. An upper end portion 294 of the finger 142 extends above the support surface 124 of the support base 122 to releasably contact with the support surface 124 of the support base 122. A support tab 298 for supporting the substrate 112 is positioned on the upper end portion 294 of the finger 142. A substrate support notch 299 is formed at an intersection of the support tab 298 with the upper end portion 294. A lower end portion 296 of the finger 142 is located eccentric from the shaft 146. The lower end portion 296 is weighted to bias the finger 142 by gravity action into a position to contact with the support surface 124 of the support base 122. As shown, when the finger 142 loses contact with the opposing plate 144, which may be achieved by moving the support assembly 120 upward in one example of implementation, the gravity action G exerted on the lower end portion 296 thereby causes the finger 142 to pivot about the shaft 146, so that the upper end portion 294 moves radially inward to contact the support surface 124 of the support base 122. As further discussed in FIGS. 3A and 3B, the three or more fingers 242 are evenly distributed along a periphery of the substrate 212 and coordinately move to support the substrate 112.

FIG. 2B is a partially enlarged cross-sectional view illustrating one centering finger 142 in a centering position. As shown in FIG. 2B, when the finger 142 loses contact with the opposing plate 144, which may be achieved by moving the support assembly 120 upward in one example of implementation, the gravity action G exerted on the lower end portion 296 thereby causes the finger 142 to pivot about the shaft 146, so that the upper end portion 294 moves radially inward to contact and exert a displacement force F on the peripheral edge of the substrate 112 in a direction toward the reference axis Z. It is worth noting that the thickness of the upper end portion 294 may be designed slightly higher than the top surface of the substrate 112. When the displacement force F is applied by the upper end portion 294, the peripheral edge of the substrate 112 can thereby be prevented from slipping over the upper end portion 294.

To release the substrate 112, FIG. 2C is a partially enlarged cross-sectional view illustrating the centering finger 142 in a disengaging position. The support base 122 may be moved downward to push the lower end portion 296 of the finger 142 into contact against the opposing plate 144, which counteracts the gravity action exerted on the lower end portion 296. As a result, the finger 142 is caused to pivot in an opposite direction so that the upper end portion 294 moves out of contact with the peripheral edge of the substrate 112.

As has been described above, the construction of the centering mechanism 140 thus is able to automatically support the substrate 112 by using the gravity action to bias each centering finger 142. The location of the centering fingers 142 on the support assembly 120 may depend on the contour shape of the substrate to center.

Figure 3A:
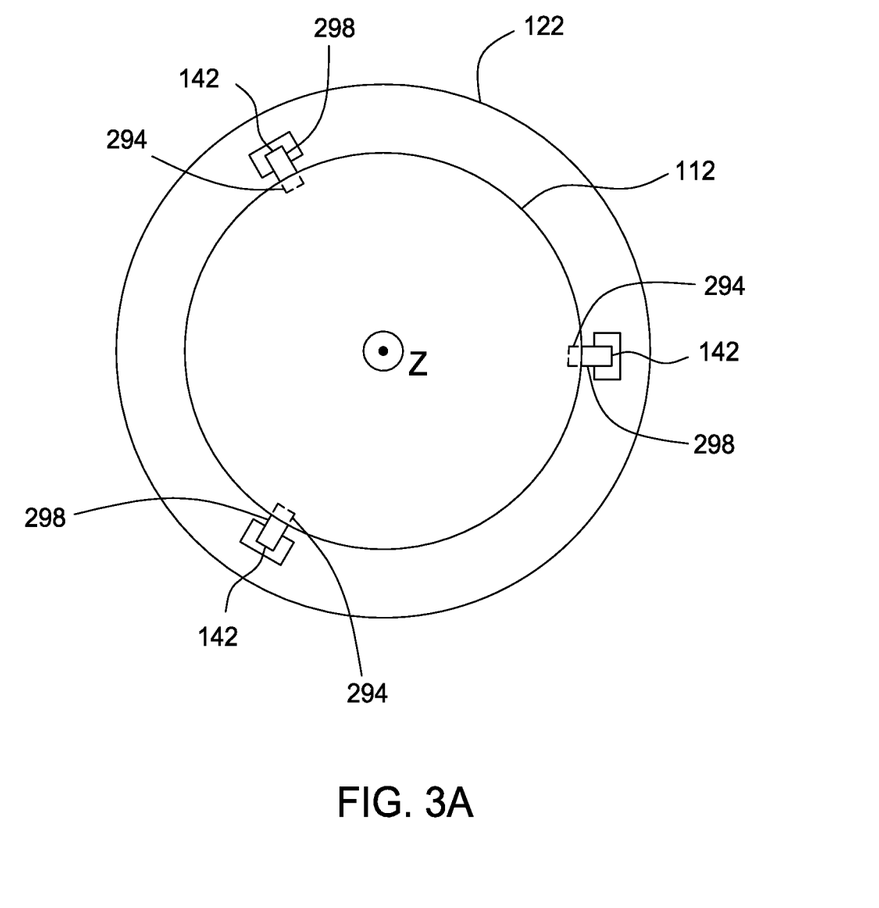
FIG. 3A is a simplified overhead view of one embodiment of a centering mechanism using three centering fingers to support a substrate.

FIG. 3A is a simplified overhead view of one embodiment in which three centering fingers 142 may be used to support a circular substrate 112 at a distance from the support base 122. The three centering fingers 142 are regularly spaced around a circle centered on the reference axis Z. The combination of each support tab 298 and the upper end portion 294 of each finger form a pocket for supporting the edge of the circular substrate 112. In other embodiments not shown, more centering fingers may be positioned in different arrangements to support other substrates of different contour shapes.

Figure 3B:
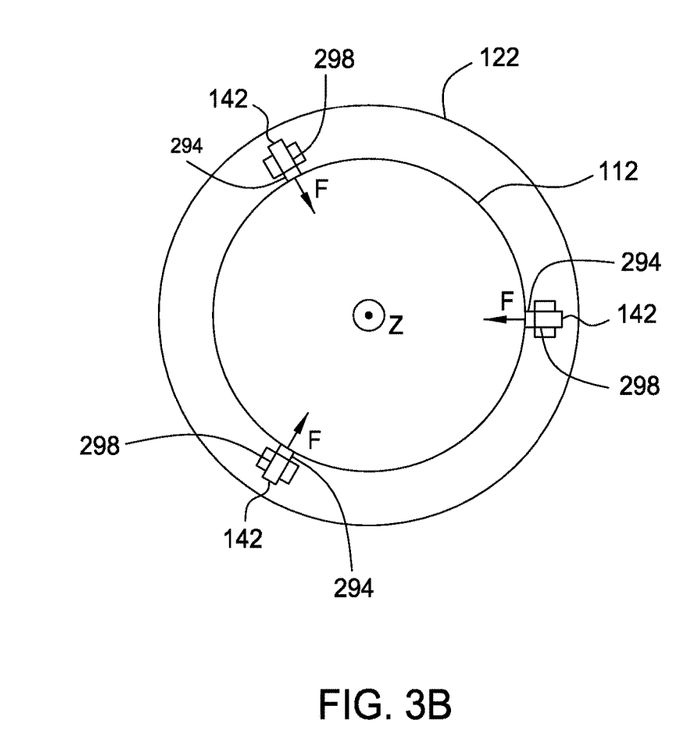
FIG. 3B is a simplified overhead view of one embodiment of a centering mechanism using three centering fingers to center a substrate.

FIG. 3B is a simplified overhead view of one embodiment of a centering mechanism 142 using three centering fingers to center a substrate 112. The three centering fingers 142 are regularly spaced around a circle centered on the reference axis Z, and each finger 142 is able to apply a radial displacement force F to center the circular substrate 112. In other embodiments not shown, more centering fingers may be positioned in different arrangements to center other substrates of different contour shapes.

To effectively center the substrate 112, each centering finger 142 also needs to apply a sufficient amount of displacement force F to move the substrate 112, which is in relation to the mass included in the weighted lower end portion 296. In one implementation, the included mass may be in a range between about 10 grams to about 500 grams. Various ways may be implemented to include the proper mass in the lower end portion 296, such as by forming a massive lower end portion 296 of a larger size.

Figure 4:
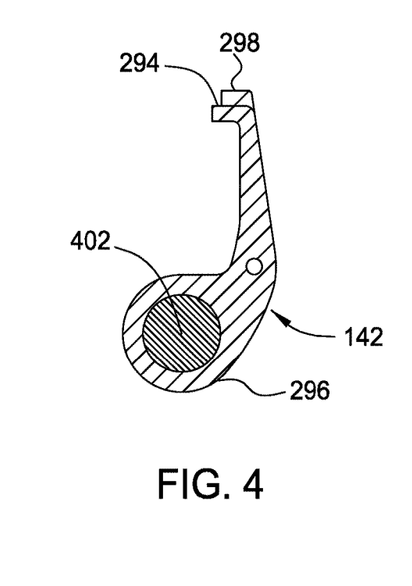
FIG. 4 is a cross-sectional view showing one embodiment of a centering finger having an eccentric weighed portion.

FIG. 4 illustrates a variant embodiment in which an embedded solid material 402 of a higher mass density may be used to form the weighted lower end portion 296 of the centering finger 242. Methods to embed the solid material 402 in the finger 142 may include, for example, sintering a ceramic material used for making the finger 142 around the solid material 402. The solid material 402 may be molybdenum or other suitable materials of a mass density higher than the surrounding material used for the finger 142. In implementations that may impose limits on the size of the weighted lower end portion 296, the use of the embedded material 402 of a higher mass density allows effectively increasing the mass of the weighted lower end portion 296 without increasing its size.

While the foregoing embodiments illustrate certain specific ways to implement and operate the centering mechanism, many variations may be envisioned. For examples, in alternate embodiments described hereafter, other constructions may be implemented for each centering finger.

Figure 5A:
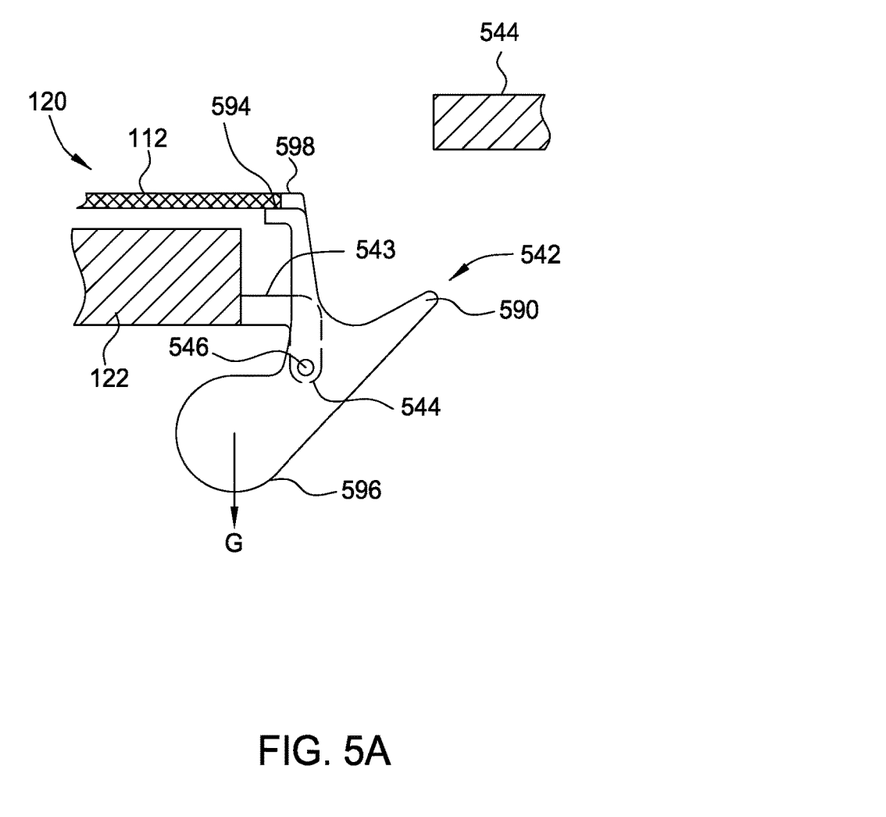
FIG. 5A is a partial cross-sectional view illustrating one embodiment of a centering finger in a supporting position.
Figure 5B:
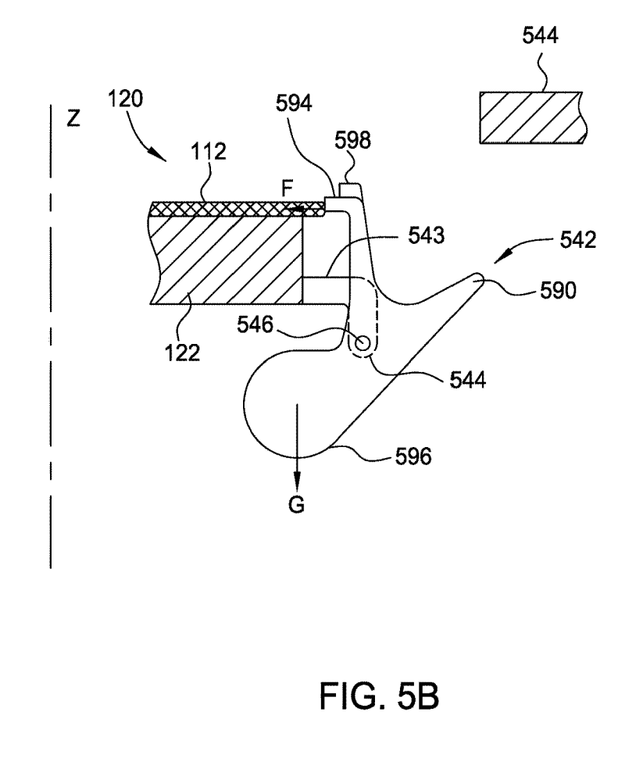
FIG. 5B is a partial cross-sectional view illustrating one embodiment of a centering finger in a centering position.
Figure 5C:
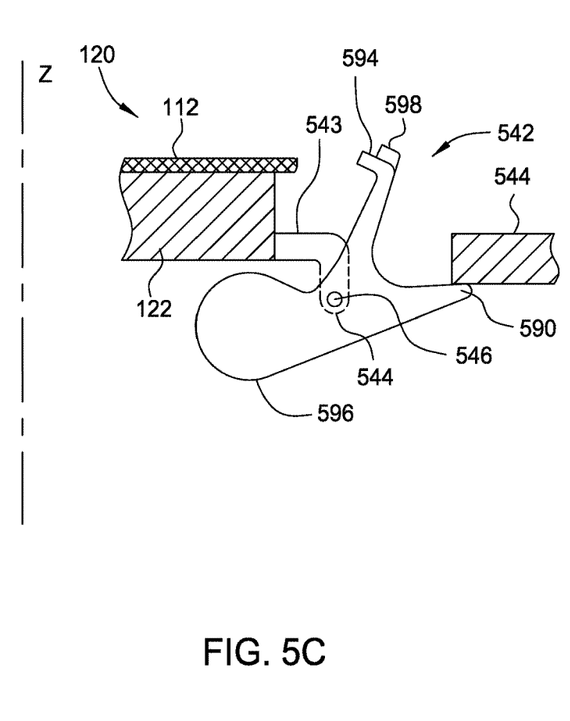
FIG. 5C is a partial cross-sectional view illustrating one embodiment of a centering finger in a disengaging position.

FIGS. 5A-5C are partial cross-sectional views illustrating another embodiment of a centering finger 542. The centering finger 542 is pivotally mounted to a bracket 543, which extends out of an outer boundary of the support base 122, via a shaft 546. The support surface of the support base 122 may be smaller than the surface area of the substrate 112, so that a peripheral portion of the substrate 112 in place on the support base 122 is free of support contact. Like the embodiments described above, the finger 542 includes an upper end portion 594 adapted to contact with the peripheral edge of the substrate 112 when the finger is in a centering position as shown in FIG. 5B and a support tab 598 for supporting the substrate when the finger 542 is in a supporting position as shown in FIG. 5A. The finger 542 further includes a weighted lower end portion 596 eccentric from the shaft 546 to bias the finger 542 into a position against the surface of the support base 122 when the finger 542 is in a supporting position. The weighted lower end portion 596 also biases the finger 542 against the peripheral edge of the substrate 512 when the finger 542 is in the centering position. In addition, the finger 542 includes a distal prong 590 that is opposite the lower end portion 596 relative to the shaft 546, and is arranged below an opposing plate 544. As shown in FIG. 5A, to support the substrate 112, the lower end portion 596 of the centering finger 542 is subject to the gravity action G that biases the finger 542 and causes the upper end portion 594 to contact the surface of the support base 122. As shown in FIG. 5B, to center the substrate 112, the lower end portion 596 of the centering finger 542 is subject to the gravity action G that biases the finger 542 and causes the upper end portion 594 to apply the displacement force F on the peripheral edge of the substrate 112.

As shown in FIG. 5C, to disengage the upper end portion 594 from the peripheral edge of the substrate 112 or the surface of the support base 122, the support assembly 120 may be moved upward so that the distal prong 590 comes into contact with the opposing plate 544. As the support assembly 120 moves further upward relative to the opposing plate 544, the gravity action on the lower end portion 596 is overcome and the finger 542 rotates about the shaft 546 to disengage the upper end portion 594 from the peripheral edge of the substrate 112. In one embodiment, the finger 542 may be released during processing upon centering, thus preventing undesired deposition on the upper end portion 594, and reducing non-uniformity of the process due to the presence of the finger 542. It is worth noting that instead of moving the support assembly 120 carrying the finger 542 relative to the opposing plate 544, alternate embodiments may design the opposing plate 544 movable relative to the support assembly 120 to contact the distal prong 590 and cause the upper end portion 594 to disengage from the substrate 112.

Figure 6:
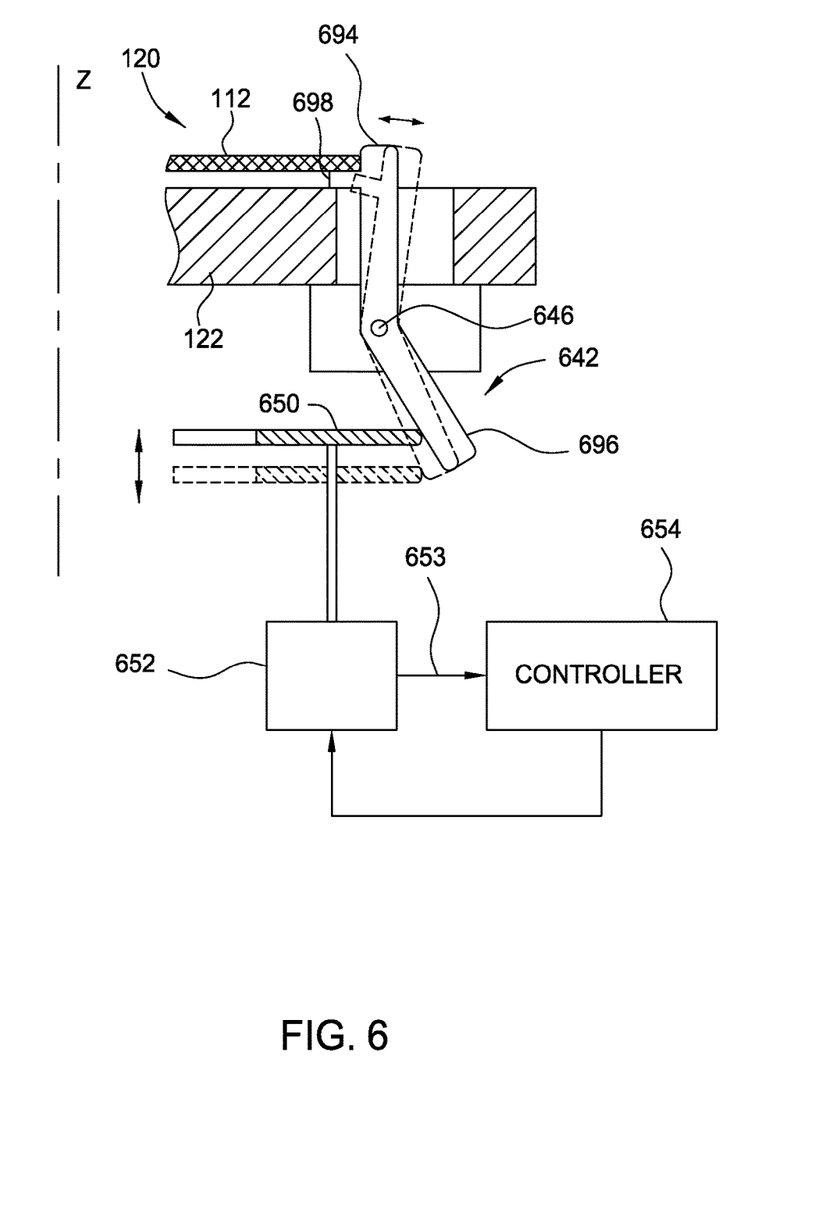
FIG. 6 is a partial cross-sectional view illustrating one embodiment of a centering finger.

FIG. 6 is a partial cross-sectional view illustrating another variant embodiment of a centering finger 642. Like the previous embodiments, the centering finger 642 is pivotally mounted on the support base 122 via a shaft 646. The centering finger 642 includes an upper end portion 694 and a support tab 698 adapted to support the substrate 112, and a weighted lower end portion 696 eccentric from the shaft 646 to bias the finger 642 under the gravity action. However, unlike the previous embodiments, the eccentricity of the lower end portion 696 relative to the shaft 646 is configured to bias the finger 642 into a position that disengages the upper end portion 694 from the substrate 112. To position the centering finger 642 in a supporting position, an opposing plate 650 that is coupled to a servo or step motor 652 and a controller 654 is controllably moved to interact with the finger 642. More specifically, the opposing plate 650 moves upward to push on the lower end portion 696 and cause the finger 642 to pivot about the shaft 646 and leave the biased position. The controller 654 receives an operation signal 653 from the motor 652, and accordingly issues a control signal to the motor 652 to control the output of the motor 652. The controlled range of upward motion of the opposing plate 650 thereby causes a controlled displacement of the upper end portion 694 to move and support the substrate 112.

In embodiments, where the centering finger 642 is in a centering position, the support tab 698 contacts a peripheral edge of the substrate 112 and the weighted lower end portion 696 moves eccentric from the shaft 646 to bias the finger 642 under the gravity action.

In one embodiment, the controller 654 monitors the force applied to a substrate being centered by each centering finger 642 using the operation signal 653. In one embodiment, the operation signal 653 may be torque of the motor 652. When the operation signal 653, e.g., torque of the motor 652, reaches a critical value indicating the force applied to the substrate being centered reaches a predetermined amount, thus, the substrate is adequately centered. The controller 654 then stops to motor 652 to avoid over centering, thus, preventing damages to the substrate.

To disengage the upper end portion 694 from substrate 112, the opposing plate 650 moves downward, which causes the finger 642 to recover the biased position under the gravity action applied on the weighted lower end portion 696.

Figure 7:
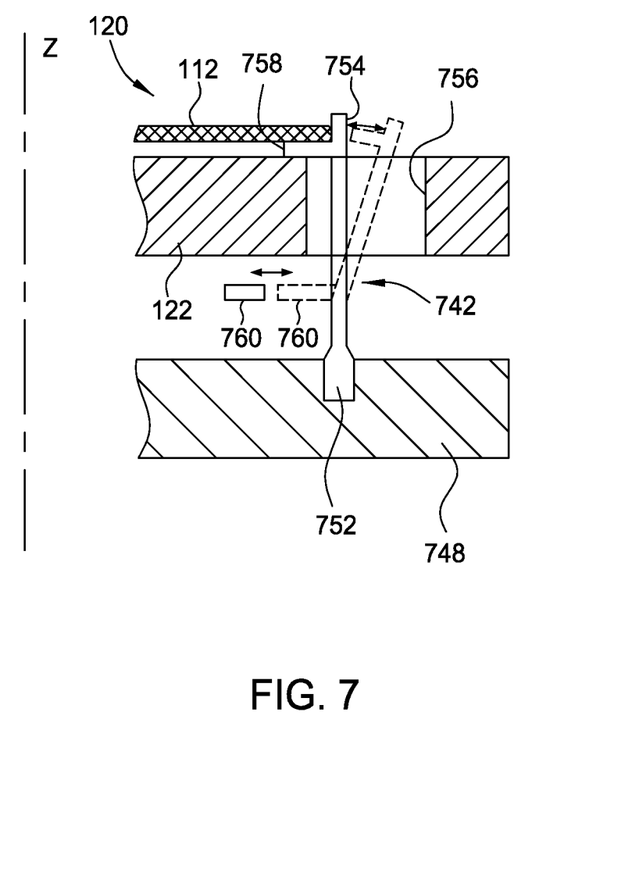
FIG. 7 is a partial cross-sectional view illustrating one embodiment of a centering finger.

FIG. 7 is a partial cross-sectional view illustrating yet another embodiment of a centering finger 742. The centering finger 742 is formed as a resilient member, such as an elongated ceramic spring, that has a first end 752 fixedly mounted on a frame 748 separate from the support base 722, and a second end 754 extending above the support base 722 through an opening 756 formed in the support base 722. The second end 754 comprises a support ledge 758 for supporting the substrate 112 when the centering finger 742 is in a supporting position. In one embodiment, to center the substrate 112 relative to the reference axis Z, the finger 742 is biased to push on the peripheral edge of the substrate 112 in a direction toward the reference axis Z. To disengage the finger 742 from the contact with the substrate 712, an opposing actuator 760 may be controllably moved to interact with the finger 742. The actuator 760 may come into contact with the finger 742, and push on the finger 742 that thereby deflects away from its biased position to disengage from the substrate 712.

Process:

Methods for centering a substrate in a processing chamber are also provided. Although discussed with reference to FIGS. 2A-2C, it should be understood that these methods are applicable to any processing system involving the heating and centering of a substrate.

In one embodiment, a substrate support assembly 120 having an embedded heater 103 and a heated support surface 124 adapted to receive a substrate 112 is provided. A plurality of centering members 142 disposed along a circle centered at a reference axis "Z" substantially perpendicular to the support surface 124 is provided. Each centering member 142 comprises an end portion 294 configured to contact a peripheral edge of the substrate 112, and the end portion 294 is radially movable towards and away from the reference axis "Z". A support tab 298 is positioned on the end portion 294 and a substrate support notch 299 is formed at an intersection of the support tab 298 and the end portion 294, for supporting the substrate 112 at a distance "A" from the support surface 124 of the substrate support assembly 120. In one embodiment, the distance "A" between the heated support surface 124 and the substrate 112 is selected such that the thermal resistance between the heated support surface 124 and the substrate 112 creates a different temperature on the substrate 112 without changing a setpoint temperature of the heater 103.

In one embodiment, the substrate 112 is positioned on the support tabs 298 of each of the plurality of centering members 124. In one embodiment, the combination of each support tab 298 and the upper end portion 294 of each of the plurality of centering members 142 form a pocket for supporting the edge of the circular substrate 112 and the substrate 112 is positioned within the pocket.

In one embodiment, a pre-treatment process is performed on the substrate 112 at a first processing temperature of the substrate 112. In one embodiment, the pre-treatment process is an anneal process. In one embodiment, the anneal process is performed at a substrate temperature of between about 250° C. and about 270° C.

In one embodiment, after the pre-treatment process, the substrate 112 is removed from the support tabs 298. The end portion 294 of each centering member 142 is moved radially outward and away from the reference axis "Z". The substrate 112 is placed on the substrate support assembly 120, wherein the substrate 112 and the centering members 142 do not contact. The end portion 294 of each centering member 142 is moved radially inwards to contact a peripheral edge of the substrate 112 for centering the substrate 112. The substrate 112 is centered using the end portions 294 of the centering members 142.

In one embodiment, after centering the substrate 112, a deposition process is performed on the substrate 112 at a second processing temperature of the substrate, wherein the first processing temperature is different from the second processing temperature. In one embodiment, the second processing temperature is between about 350° C. and about 400° C.

In one embodiment, a setpoint temperature of the heater 103 is the same for both the pretreatment process and the deposition process. In one embodiment, the setpoint temperature of the heater 103 is the same as the temperature of the deposition process. In one embodiment, the setpoint temperature of the heater 103 is between about 350° C. and about 400° C.

While the foregoing is directed to embodiments of the present invention, other and further embodiments of the invention may be devised without departing from the basic scope thereof, and the scope thereof is determined by the claims that follow.

The invention claimed is:

1. An apparatus for positioning a substrate in a processing chamber, comprising:
a substrate support having a support surface adapted to receive the substrate; a plurality of centering fingers for supporting the substrate at a distance parallel to the support surface and for centering the substrate relative to a reference axis substantially perpendicular to the support surface, wherein the plurality of centering fingers are movably disposed along a periphery of the support surface, and each of the plurality of centering fingers comprises:
a first end portion for either contacting or supporting a peripheral edge of the substrate, the first end portion comprising:
an upper end portion extending above the support surface of the substrate support for releasably contacting the peripheral edge of the substrate;
a support tab positioned on the upper end portion; and
a substrate support notch formed by an intersection of the support tab and the upper end portion, for supporting the substrate; and
a lower end portion having an embedded mass of solid material weighted to bias the centering finger by gravity action into a first position to contact the support surface; and
wherein the plurality of centering fingers are configured to perform a centering sequence including a backward movement of the first end portion from the first position to a second position and a forward movement of the first end portion from the second position to the first position, and
wherein the backward movement causes the centering finger to release the peripheral edge of the substrate, the release causing the substrate to rest on the support surface, and the forward movement causes the centering finger to push the substrate placed on the support surface in a direction toward the reference axis to position the substrate.

2. The apparatus of claim 1, wherein the substrate support encapsulates at least one embedded heater operable to controllably heat the substrate support and the substrate positioned thereon to a predetermined temperature.

3. The apparatus of claim 1, further comprising a circumscribing shadow frame positioned to prevent deposition on the peripheral edge of the substrate, the substrate support, and the plurality of centering fingers for reducing flaking and particle contamination in the processing chamber.

4. The apparatus of claim 2, further comprising:
a fiber optic temperature sensor for providing a metric indicative of a temperature profile of a backside of the substrate, wherein the fiber optic temperature sensor is positioned in the substrate support.

5. The apparatus of claim 2, further comprising:
one or more purge gas inlets coupled with a purge gas source for supplying purge gas to a backside of the substrate for preventing particle contamination caused by deposition on the backside of the substrate when the substrate is supported by the plurality of centering fingers, wherein the one or more purge gas inlets are positioned in the substrate support.

6. The apparatus of claim 1, further comprising an opposing member for interacting with each of the plurality of centering fingers to move the first end portion.

7. The apparatus of claim 6, wherein the opposing member is configured to move the first end portion of each of the plurality of centering fingers towards the second position, and each of the plurality of centering fingers is independently biased towards the first position, and a combination of biasing forces from the plurality of centering fingers centers the substrate relative to the reference axis.

8. The apparatus of claim 1, wherein each of the plurality of centering fingers is made of a material including ceramic, aluminum nitride, aluminum oxide, aluminum, or combinations thereof.

9. The apparatus of claim 1, wherein the lower end portion is eccentric from a shaft which pivotally mounts the centering finger to the substrate support, wherein the first end portion and the lower end portion are disposed on opposing sides of the shaft.

* * * * *